United States Patent [19]

Kobayashi

[11] Patent Number: 5,019,731
[45] Date of Patent: May 28, 1991

[54] ANALOG SWITCH CIRCUIT

[75] Inventor: Osamu Kobayashi, Yokohama, Japan

[73] Assignee: Fujitsu Limited, Kawasaki, Japan

[21] Appl. No.: 348,913

[22] Filed: May 8, 1989

[30] Foreign Application Priority Data

May 31, 1988 [JP] Japan .................................. 63-133657

[51] Int. Cl.⁵ ..................... H03K 17/687; H03K 17/16
[52] U.S. Cl. ..................................... 307/571; 307/585; 307/443
[58] Field of Search ............... 307/571, 572, 575, 577, 307/583, 584, 585, 576, 579, 353, 443

[56] References Cited

U.S. PATENT DOCUMENTS

| 4,308,468 | 12/1981 | Olson | 307/353 |
| 4,393,318 | 7/1983 | Takahashi et al. | 307/577 |
| 4,511,814 | 4/1985 | Matsuo et al. | 307/577 |
| 4,651,037 | 3/1987 | Ogasawara et al. | 307/577 |

FOREIGN PATENT DOCUMENTS

| 0020160 | 12/1980 | European Pat. Off. | |
| 0117318 | 7/1984 | Japan | 307/584 |
| 60-90245 | 5/1985 | Japan | |
| 63-50208 | 3/1988 | Japan | |

OTHER PUBLICATIONS

Patent Abstracts of Japan, vol. 12, No. 268, (E-638)(3115), Jul. 27, 1988; & JP-A-6350208, (Sony), 03.03.1988.
Patent Abstracts of Japan, vol. 9, No. 240 (E-345)(1963) Sep. 26, 1985; JP-A-6090425 (Nippon Denki K.K.) 21.05.1985.
IEEE Journal of Solid-State Circuits, vol. SC-20, No. 6, Dec. 1985, pp. 1206-1213, New York, U.S.; W. B. Wilson et al.: "Measurement and Modeling of Charge Feedthrough in N-Channel MOS Analog Switches".

Primary Examiner—Stanley D. Miller
Assistant Examiner—Trong Q. Phan
Attorney, Agent, or Firm—Amrstrong, Nikaido, Marmelstein, Kubovcik & Murray

[57] ABSTRACT

An analog switch circuit includes an input terminal to which an analog signal is supplied, an output terminal, first, second and third transistors, and a delay circuit. The first transistor has first and second electrodes and a gate, and the first electrode of the first transistor is connected to the input terminal. The second transistor has first and second electrodes and a gate, and the first electrode of the second transistor is coupled to the first electrode of the first transistor. The gate of the second transistor is supplied with a clock signal supplied from an external circuit. The delay circuit delays the clock signal by a predetermined time and generates a delayed clock signal supplied to the gate of the first transistor. The third transistor has first and second electrodes and a gate. The first and second electrodes of the third transistor are coupled to each other and to the second electrode of the second transistor and the output terminal through which an analog output signal is output. The gate of the third transistor is controlled so that the third transistor is turned ON when the second transistor is turned OFF.

22 Claims, 6 Drawing Sheets

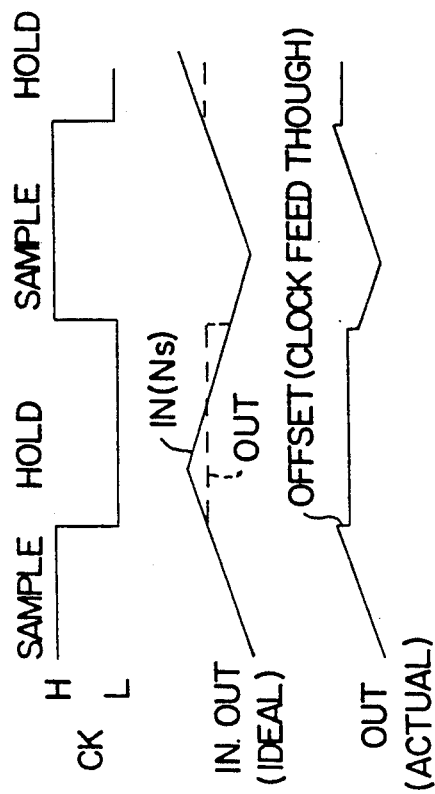
FIG. IB PRIOR ART
FIG. IC PRIOR ART
FIG. ID PRIOR ART
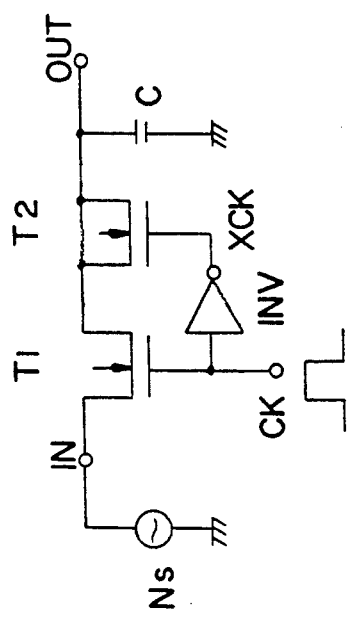
FIG. IA PRIOR ART FIG. 3B
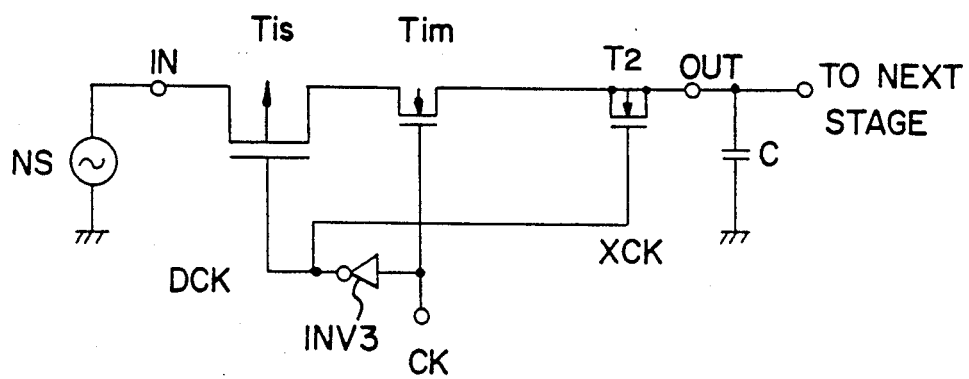
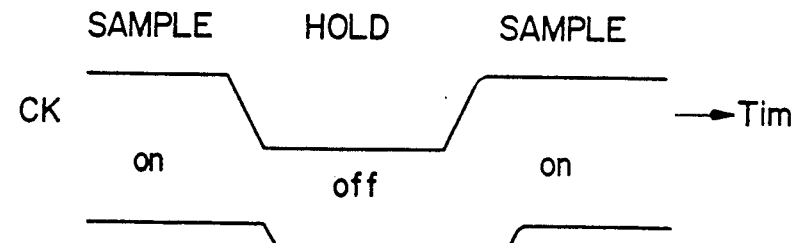
FIG. 4A
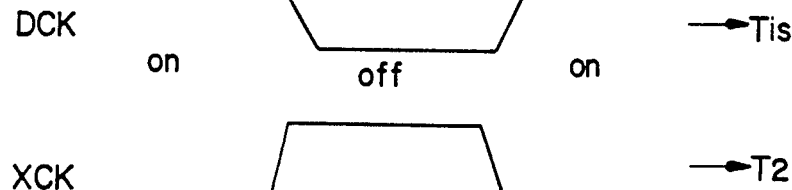
FIG. 4B
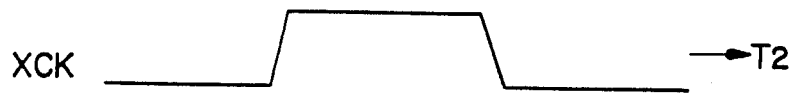
FIG. 4C
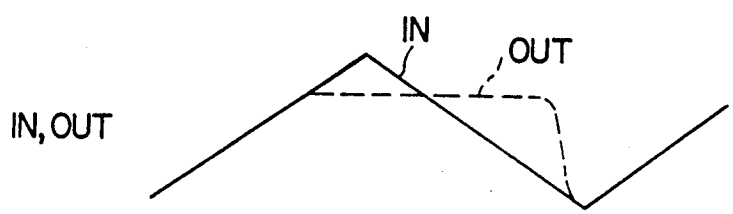
FIG. 4D

VOLTAGE DIFFERENCE IN→OUT

Tim VOLTAGE

SMALL CHANGE

Tis VOLTAGE

LARGE CHANGE

ANALOG SWITCH CIRCUIT

BACKGROUND OF THE INVENTION

The present invention generally relates to an analog switch circuit, and particularly to a semiconductor analog switch circuit having the function of controlling transfer of an analog signal.

An analog switch circuit for controlling an analog signal by a digital signal is widely used in a variety of systems. Currently, it is desired to present an analog switch of high speed, high breakdown voltage and high precision.

A conventional analog switch circuit is illustrated in FIG. 1A. Referring to FIG. 1A, an ON/OFF control (a sample and hold operation) for an analog signal is carried out by a single transistor T1 of a metal oxide semiconductor transistor (MOS transistor) or a junction field-effect transistor (JFET). The transistor T1 is controlled by a clock signal CK supplied from an external circuit. An example of the clock signal CK is illustrated in FIG. 1B. In ideal switching operation, signals appearing at an input terminal IN and an output terminal OUT change as shown in FIG. 1C in response to the clock signal CK. Actually, as shown in FIG. 2, a charge (an electron for the illustrated case) existing in a channel of the transistor T1 in ON state (channel charge), flows out and is injected into circuits provided on both sides of the transistor T1. This is called "clock feed through phenomenon".

The clock feed through phenomenon causes the following undesirable operation. As is shown in FIG. 1A, a load C consisting of only a capacitive element is connected to the output terminal OUT and the drain of the transistor T1. The charge due to the clock feed through phenomenon is injected into the capacitive load C. The injected charge is added to a charge which is previously injected into the capacitive load C from a signal source Ns, and causes an offset in the voltage derived from the charge stored in the capacitive load C, as shown in FIG. 1D. A transistor T2 is provided in order to prevent the occurrence of the offset. The transistor T2 has a gate area approximately half that of the transistor T1 and is of a conduction type identical to that of the transistor T1. The drain and source of the transistor T2 are mutually connected. The transistor T2 is controlled by an inverter INV, which inverts the clock signal CK. When the transistor T1 is turned OFF, the channel charge flows out on both the sides thereof half and half. At this time, the transistor T2 is turned ON and absorbs the channel charge in a channel formed under the gate thereof.

Actually, however, conditions such as impedance on both the sides of the transistor T1 are not the same as each other. For this reason, the amount of charge occurring on one side of the transistor T1 is not identical to the amount of charge occurring on the other side thereof. Therefore, generally, all the charge flowing out of the transistor T1 is not absorbed into the channel of the transistor T2. As a result, it is impossible to effectively prevent the occurrence of the offset. Analog switch circuits similar to the circuit of FIG. 1A are disclosed in Japanese Laid-Open Patent Application Nos. 60-90425 and 63-50208, for example.

It is required to reduce the gate-channel capacitance of the transistor T1 in order to suppress the clock feed through. This can be done by forming a thick gate insulating layer of the MOS transistor forming the transistor T1 or by forming a narrow channel width thereof. However, the above increases ON resistance of the transistor T1. Alternatively, it is possible to reduce the channel length of the transistor T1. However, in the alternative, the breakdown voltage of the transistor T1 decreases. It can be seen from the above description that currently there is no effective solution for reducing the offset due to the occurrence of the clock feed through. Therefore, it is desired to overcome the above-mentioned disadvantages and present an analog switch circuit of high speed, high breakdown voltage and high precision.

SUMMARY OF THE INVENTION

It is therefore a general object of the present invention to provide a novel and useful analog switch circuit in which the above-mentioned disadvantages are eliminated.

A more specific object of the present invention is to provide an analog switch circuit of high speed, high breakdown voltage and high precision.

The above objects of the present invention can be achieved by an analog switch circuit including an input terminal to which an analog signal is supplied, an output terminal, first, second and third transistors, and a delay circuit. The first transistor has first and second electrodes and a gate, and the first electrode of the first transistor is connected to the input terminal. The second transistor has first and second electrodes and gate, and the first electrode of the second transistor is coupled to the second electrode of the first transistor. The gate of the second transistor is supplied with a clock signal. The delay circuit delays the clock signal by a predetermined time and generates a delayed clock signal supplied to the gate of the first transistor. The third transistor has first and second electrodes and a gate. The first and second electrodes of the third transistor are coupled to each other and to the second electrode of the second transistor and the output terminal through which an analog output signal is output. The gate of the third transistor is controlled so that the third transistor is turned ON when the second transistor is turned OFF.

Other objects, features and advantages of the present invention will become apparent from the following detailed description when read in conjunction with the accompanying drawings.

BRIEF DESCRIPTION OF THE DRAWINGS

FIG. 1A is a circuit diagram of a conventional analog switch circuit;

FIGS. 1B–1D are views illustrating waveforms of signals appearing at portions of the circuit of FIG. 1A;

FIG. 2 is a view illustrating the mechanism of the occurrence of a clock feed through;

FIG. 3B is a circuit diagram of a variation of the first embodiment of FIG. 3A;

FIG. 4A–4G are views illustrating waveforms of signals appearing at portions of the circuit of FIG. 3A;

DESCRIPTION OF THE PREFERRED EMBODIMENTS

Figure 2:
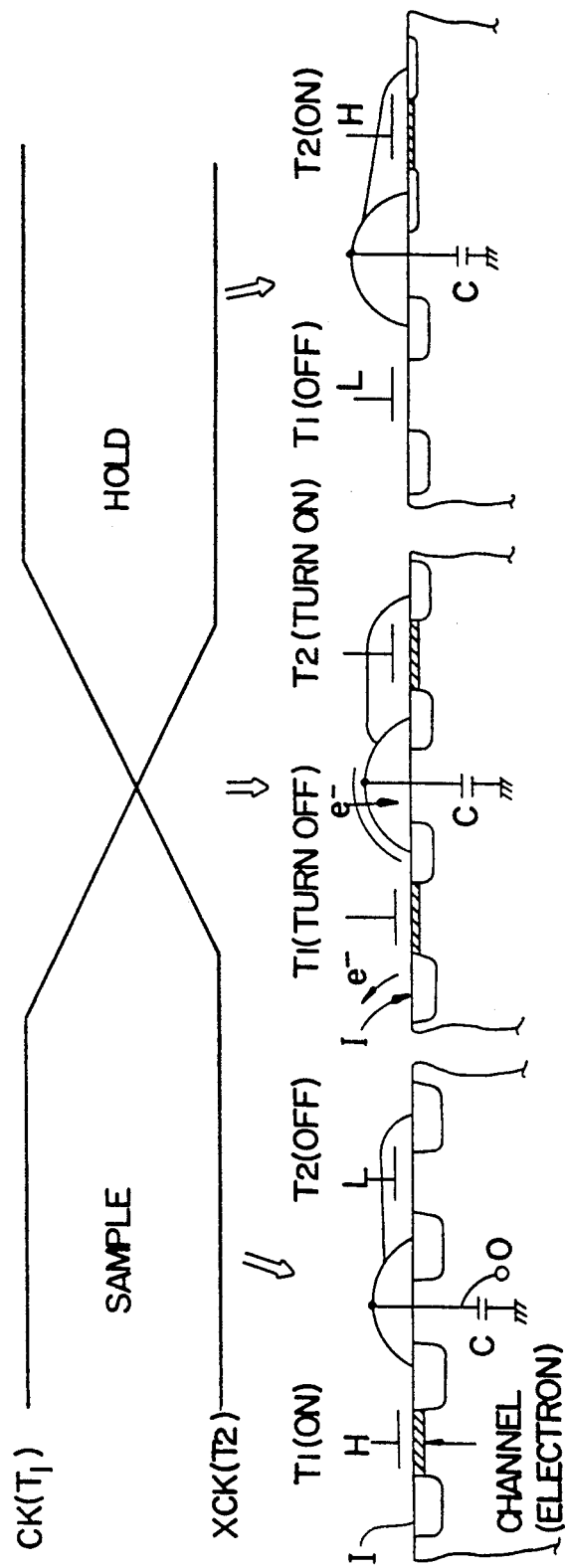
Figure 3A:
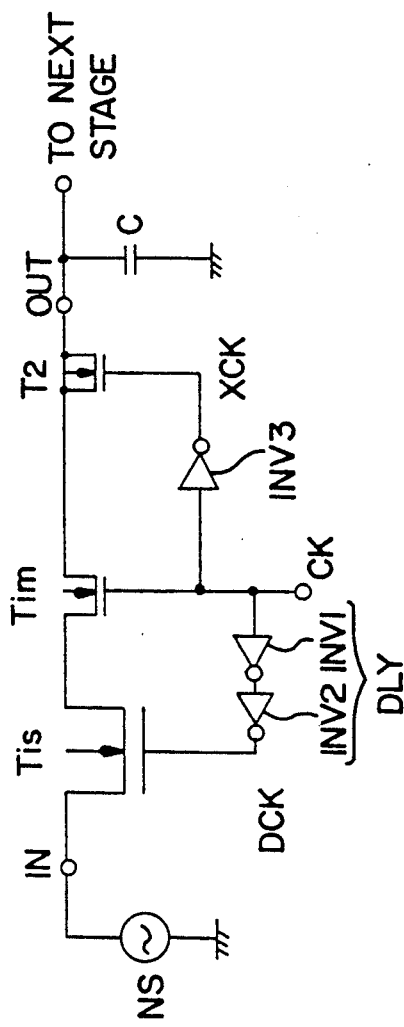
FIG. 3A is a circuit diagram of a first preferred embodiment of the present invention.
Figure 4E:
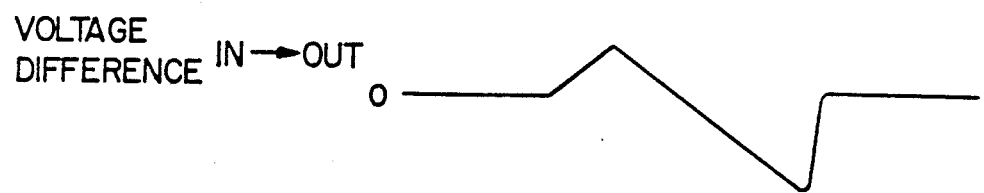

A description is given of a first preferred embodiment of the present invention with reference to FIGS. 3A and 4.

Referring to FIG. 3A, there is illustrated an analog switch circuit of the first embodiment. Referring to FIG. 3A, a signal source Ns is connected to the source of an N-channel MOS transistor (hereinafter simply referred to as a transistor) T1s through an input terminal IN. The drain of the transistor T1s is connected to the source of an N-channel MOS transistor T1m. A clock signal CK is supplied directly to the gate of the transistor T1m from an external device, and supplied to the gate of the transistor T1s through two inverters INV1 and INV2 which are connected in series to form a delay circuit DLY. The delay circuit DLY outputs a delayed clock signal DCK, which is to be supplied to the gate of the transistor T1s. When the transistors T1s and T1m are of the N-channel type, the delay circuit DLY includes an even number of inverters connected in series. The delay circuit DLY delays the clock signal CK so that the transistor T1s is turned OFF when the transistor T1m is completely cut off. The drain of the transistor T1m is connected to the source of an N-channel MOS transistor T2, which is also connected to the drain thereof. An inverter INV3 inverts the clock signal CK and outputs an inverted clock signal XCK, which is applied to the gate of the transistor T2. The drain and source of the transistor T2 are connected to an output terminal OUT, to which a capacitive load C is coupled.

The transistor T2 is used for canceling the charge due to the clock feed through, and has a channel area approximately half that of the transistor T1m. The transistor T2 is supplied with the inverted clock signal XCK 180° out of phase with the clock signal CK to form a channel when the transistor T1m is turned OFF. The charge flowing out of the transistor T1m is absorbed in the formed channel. The illustrated circuit is a sample and hold circuit.

Figure 4F:
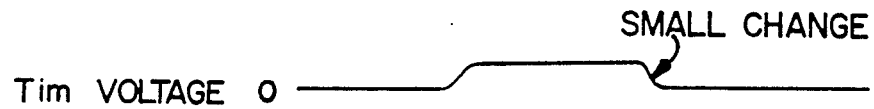
Figure 4G:
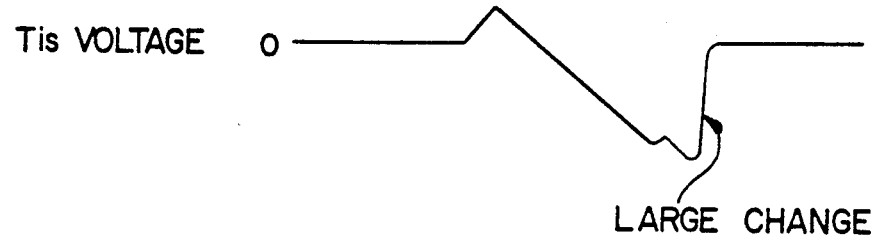

In operation, due to the presence of the inverters INV1 and INV2, the transistor T1m is turned OFF before the transistor T1s is turned OFF (FIG. 4A and B). Therefore, this prevents the clock feed through occurring when the transistor T1s is turned OFF, from being transferred to the output terminal OUT. Further, since the transistor T1s is turned OFF immediately after the transistor T1m is turned OFF, the source-drain voltage of the transistor T1m hardly varies with respect to a voltage value (approximately zero) of the source-drain voltage of the transistor T1m appearing when the transistor T1m is ON (FIG. 4F). During the above-mentioned operation, the source-drain voltage of the transistor T1s varies as shown in FIG. 4G, and the difference in voltage between the input terminal IN and output terminal OUT varies as shown in FIG. 4D.

The transistor T1m can be formed by a low voltage transistor with a short channel length and a narrow channel width, or a small clock feed through. The transistor T1s can be formed by a high voltage transistor with a long channel length and a wide channel width, or a large clock feed through. It is required to set ON resistance of the transistor T1s as small as possible. It can be seen from the above description that the combination of the transistors T1m and T1s can effectively present an analog switch circuit of high breakdown voltage, suppressed clock feed through, and low ON resistance.

FIG. 3B shows a variation of the first embodiment. Referring to FIG. 3B, a P-channel transistor is substituted for the N-channel transistor forming the transistor T1s. The inverter INV3 functions as a delay circuit which delays the clock signal CK. Further, the inverter INV3 supplies the gates of the transistors T1s and T2 with the inverted clock signal XCK. It is noted that in the case where the transistor T1s is of the P-channel type, the delay circuit DLY includes an odd number of inverters. The variation operates in a way similar to the first embodiment.

Figure 5:
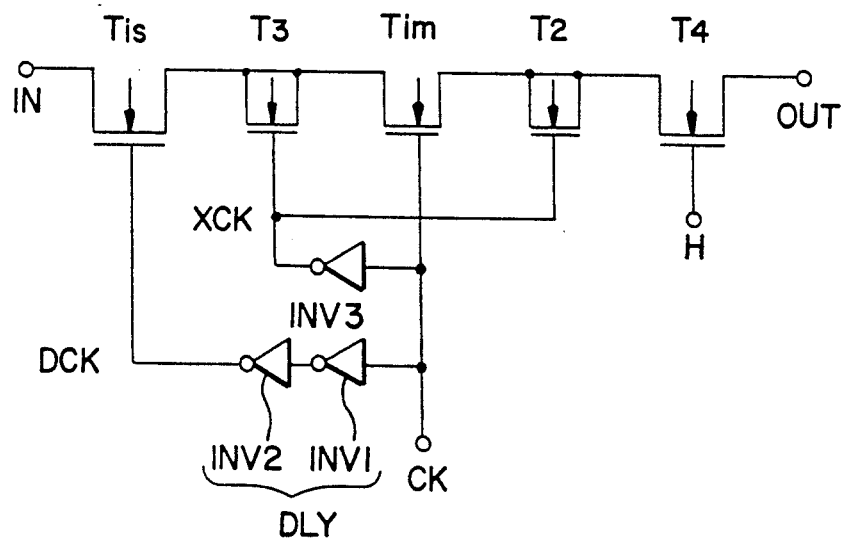
FIG. 5 is a circuit diagram of a second preferred embodiment of the present invention.

A description is given of a second preferred embodiment of the present invention with reference to FIG. 5, in which those parts which are the same as those in FIG. 3A are given the same reference numerals. The second embodiment is constructed by adding N-channel MOS transistors T3 and T4 to the circuit of FIG. 3A. In FIG. 5, the signal source Ns and the capacitive load C are omitted for convenience' sake. It is to be noted that the transistors T3 and T4 are provided in order to establish symmetry of the circuit with respect to the transistor T1m. The transistor T2 is equivalent to the transistor T3, and the transistor T1s is equivalent to the transistor T4. The source and drain of the transistor T3 are connected to the drain of the transistor T1s. The gate of the transistor T3 is supplied with the inverted clock signal XCK. The source of the transistor T4 is connected to the source and drains of the transistor T2. The gate of the transistor T4 is supplied with a high-level signal (H), in order that the transistor T4 is always held ON and thereby the clock feed through is prevented from occurring in the transistor T4. After the transistor T1m is switched from ON to OFF, the transistor T1s is ON. Therefore even at this time, it is possible to hold the symmetry of circuit with respect to the transistor T1m. According to the second embodiment, it is possible to further suppress the clock feed through.

Figure 6:
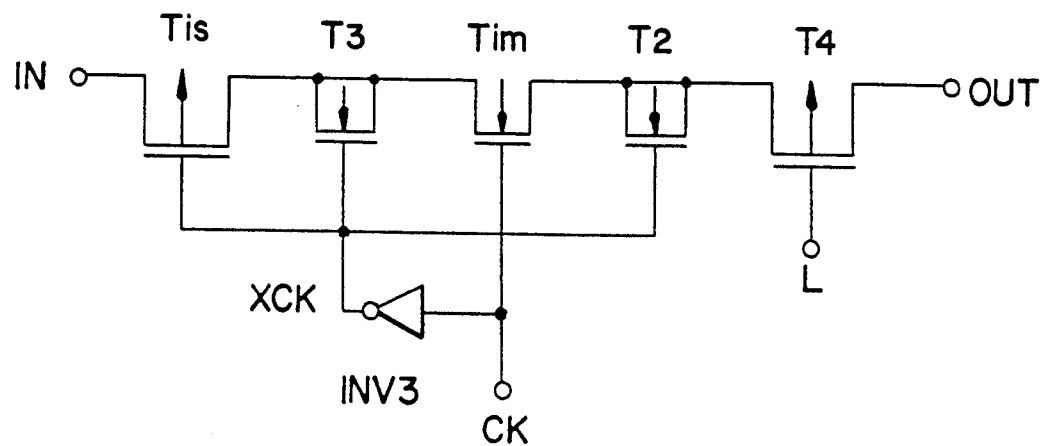
FIG. 6 is a circuit diagram of a third embodiment of the present invention.

A description is given of a third preferred embodiment of the present invention with reference to FIG. 6, in which those parts which are the same as those in FIGS. 3A and 5 are given the same reference numerals. The third embodiment of FIG. 6 corresponds to a variation of the second embodiment of FIG. 5. That is, the transistors T1s and T4 of the N-channel type in the second embodiment are replaced with P-channel transistors. The gate of the transistor T1s is supplied with the inverted clock signal XCK from the inverter INV3. In the third embodiment, the inverter INV3 also functions as a delay circuit. The gate of the transistor T4 is continuously supplied with a low-level signal (L) so as to always keep the transistor T4 ON. The transistors illustrated in FIG. 6 function in the same way as the corresponding transistors used in the second embodiment. The third embodiment has the same advantages as the second embodiment.

Figure 7:
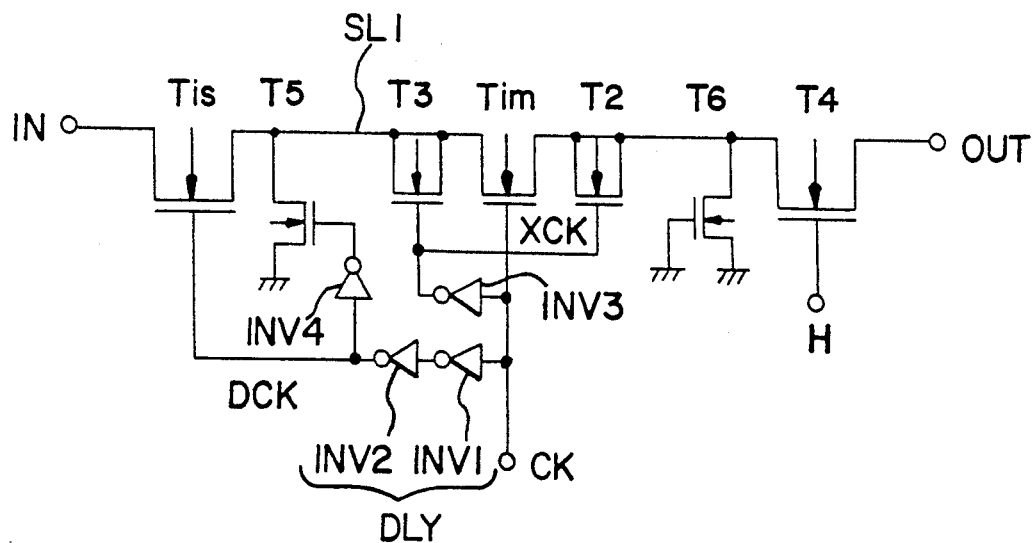
FIG. 7 is a circuit diagram of a fourth embodiment of the present invention.

A description is given of a fourth preferred embodiment of the present invention with reference to FIG. 7. The fourth embodiment is constructed by adding N-channel transistors T5 and T6 to the circuit of FIG. 5. The gate of the transistor T5 is supplied with a clock signal derived from an inverter INV4, to which the clock signal DCK is supplied. The transistor T5 has the function of fixing a signal line SL1 to ground level when the transistors T1m and T1s are OFF, or in other words, the clock signal CK is held at low level. The signal line SL1 mutually connects the drain of the transistor T1s, the source and drain of the transistor T3, and the source of the transistor T1m. The transistor T5 can prevent the signal line SL1 from becoming a floating state and thereby prevent a voltage exceeding a predetermined breakdown voltage of the transistor T1m from being applied thereto. The transistor T6 is provided in order to establish the symmetry of circuit with respect to the transistor T1m. The source and gate of the transistor T6 is fixed to ground level.

Figure 8A:
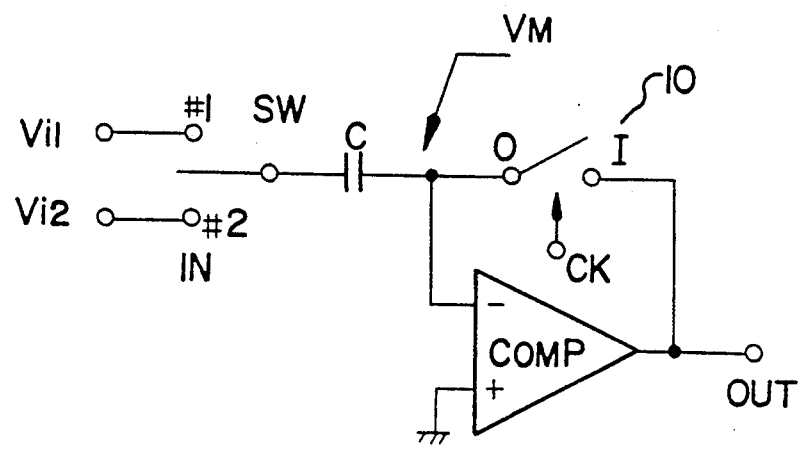
FIG. 8A is a circuit diagram illustrating an application of the present invention.

FIG. 8A is a circuit diagram of an application of the present invention. The illustrated application is a comparator having an offset cancel function. An analog switch 10 is formed by one of the aforementioned embodiments of the present invention. Voltage signals Vi1 and Vi2 to be compared are applied to input terminals #1 and #2 of a switch SW, respectively. An output terminal of the switch SW is connected to an inverting input terminal of a comparator COMP of an operational amplifier through the capacitor C and to a terminal (0) of the analog switch 10, which corresponds to the output terminal OUT of each of the embodiments. A non-inverting input terminal of the comparator COMP is fixed to ground level. An output terminal of the comparator COMP is connected to a terminal (I) of the analog switch circuit 10, which is controlled by the clock signal CK. The terminal (I) of the analog switch 10 corresponds to the input terminal IN in each of the embodiments. It is noted that it is unnecessary to form the switch SW by an analog switch circuit of small clock feed through.

Figure 8B:
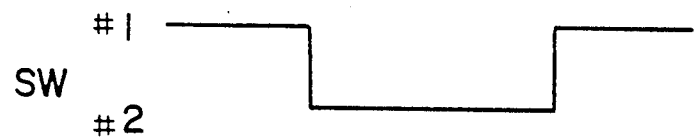
FIG. 8B-8E are views illustrating waveforms of signals appearing at portions of the circuit of FIG. 8A.
Figure 8C:
Figure 8D:
Figure 8E:

In operation, when the switch SW selects the input terminal #1 and the analog switch 10 is ON, the capacitor C is charged up to the sum of the voltage Vi1 and the offset voltage of the comparator COMP. Thereafter, the switch 10 is turned OFF as shown in FIG. 8C. At this time, unless clock feed through occurs in the analog switch 10, there is no change of voltage $V_M$ at the inverting input terminal of the comparator COMP and therefore the voltage of the output terminal OUT. Thereafter, as shown in FIG. 8B, the switch SW is switched to the input terminal #2. Thereby, the voltage $V_M$ increases by (Vi2−Vi1) as shown in FIG. 8D. This is detected by the comparator COMP, which charges the voltage of the output terminal OUT. That is, when Vi2>Vi1, the voltage of the output terminal OUT is lower than zero volt. On the other hand, when Vi2<Vi1, the voltage of the output terminal OUT exceeds 0 volt. It is noted that the offset voltage results from the phenomenon that the charge generated when the analog switch 10 is turned OFF, is injected into the capacitor C.

The transistors used in the aforementioned embodiments may be MOS transistors or JFETs.

The present invention is not limited to the aforementioned embodiments, and variations and modifications may be made without departing from the scope of the present invention.

What is claimed is:

1. An analog switch circuit, comprising:
   an input terminal to which an analog signal is supplied;
   an output terminal;
   a first transistor having first and second electrodes and a gate, the first electrode of said first transistor being connected to said input terminal;
   a second transistor having first and second electrodes and a gate, the first electrode of said second transistor being coupled to the second electrode of said first transistor, the gate of said second transistor being supplied with a clock signal;
   delay means operably connected between the gate of said first transistor and the gate of said second transistor, wherein said delay means is for delaying said clock signal by a predetermined time and generating a delayed clock signal supplied to the gate of said first transistor; and
   a third transistor having first and second electrodes and a gate, the first and second electrodes of said third transistor being coupled to each other and to the second electrode of said second transistor and said output terminal through which an analog output signal is output, the gate of said third transistor being controlled so that said third transistor is turned ON when said second transistor is turned OFF.

2. An analog switch circuit as claimed in claim 1, wherein said first transistor has a source-drain breakdown voltage between the first and second electrodes thereof which is higher than that of said second transistor.

3. An analog switch circuit as claimed in claim 1, wherein said first transistor has a channel length longer than that of said second transistor, and a channel width wider than that of said second transistor.

4. An analog switch circuit as claimed in claim 1, wherein said first transistor and said second transistor are of an identical conduction type, and wherein said delay means comprises an even number of inverters connected in series.

5. An analog switch circuit as claimed in claim 1, wherein said first transistor is of a conduction type opposite to that of said second transistor, and wherein said delay means comprises an odd number of inverters.

6. An analog switch circuit as claimed in claim 1, wherein said delay means delays said clock signal so that said first transistor is turned OFF by applying said delayed clock signal applied thereto when said second transistor is completely cut off.

7. An analog switch circuit as claimed in claim 1, further comprising:
   a fourth transistor having first and second electrodes and a gate, the first and second electrodes of said fourth transistor being connected to each other and to the second electrode of said first transistor and the first electrode of said second transistor, the gate of said fourth transistor being controlled so that said fourth transistor is turned ON at the same time as said third transistor is turned ON; and
   a fifth transistor having a first electrode connected to the first and second electrodes of said third transistor, a second electrode connected to said output terminal, and a gate to which a fixed level signal is continuously applied.

8. An analog switch circuit as claimed in claim 7, wherein said fourth transistor is of almost the same size as said third transistor.

9. An analog switch circuit as claimed in claim 7, wherein said fifth transistor is of almost the same size as said first transistor.

10. An analog switch circuit as claimed in claim 7, wherein each of said first through fifth transistors is an N-channel transistor, and said fixed level signal applied to the gate of said fifth transistor is a high-level signal.

11. An analog switch circuit as claimed in claim 10, wherein said delay means comprises an even number of inverters connected in series.

12. An analog switch circuit as claimed in claim 7, wherein each of said first and fifth transistors is a P-channel transistor, and each of said second, third and fourth transistors is an N-channel transistor, and wherein said fixed level signal applied to the gate of said fifth transistor is a low-level signal.

13. An analog switch circuit as claimed in claim 12, wherein said delay means comprises an odd number of inverters.

14. An analog switch circuit as claimed in claim 12, wherein said delay means comprises an odd number of inverters, and said delayed signal is supplied to the gate of said third transistor.

15. An analog switch circuit as claimed in claim 7, further comprising:
- a sixth transistor having a first electrode being connected to a predetermined power source, a second electrode connected to the second electrode of said first transistor, the first and second electrodes of said fourth transistor, and a gate being controlled so that the second electrode of said first transistor is fixed to ground level when said first and second transistors are OFF; and
- a seventh transistor having a first electrode connected to the first and second electrodes of said third transistor and the first electrode of said fifth transistor, and having a second electrode and gate each being connected to said predetermined power source.

16. An analog switch circuit as claimed in claim 15, wherein each of said first through seventh transistors is an N-channel transistor.

17. An analog switch circuit as claimed in claim 15, wherein said sixth transistor fixes the second electrode of said first transistor, the first and second electrodes of said fourth transistor to a potential of said predetermined power source, when said sixth transistor is turned ON.

18. An analog switch circuit as claimed in claim 16, wherein said delay means comprises an even number of inverters series connected, and wherein said fixed level signal applied to the gate of said fifth transistor is a high-level signal.

19. An analog switch circuit as claimed in claim 1, wherein each of said first, second and third transistors is a metal oxide semiconductor transistor.

20. An analog switch circuit as claimed in claim 1, wherein each of said first, second and third transistors is a junction field-effect transistor.

21. An analog switch circuit as claimed in claim 1, further comprising an inverter inverting said clock signal to generate an inverted clock signal, which is supplied to the gate of said third transistor of a conduction type opposite to that of said first transistor.

22. An analog switch circuit as claimed in claim 1, wherein one of said first and third transistors is ON, when the other of said first and third transistors is OFF.

* * * * *